United States Patent
Zhang

(10) Patent No.: US 7,038,510 B2
(45) Date of Patent: May 2, 2006

(54) PHASE ADJUSTMENT METHOD AND CIRCUIT FOR DLL-BASED SERIAL DATA LINK TRANSCEIVERS

(75) Inventor: Bo Zhang, Las Flores, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/882,428

(22) Filed: Jul. 2, 2004

(65) Prior Publication Data

US 2006/0002497 A1    Jan. 5, 2006

(51) Int. Cl.
*H03L 7/06* (2006.01)
(52) U.S. Cl. ............................. 327/158; 327/149
(58) Field of Classification Search ............ 327/149, 327/153, 158, 161; 375/375, 376; 331/17, 331/25

See application file for complete search history.

(56) References Cited

U.S. PATENT DOCUMENTS

2004/0252804 A1* 12/2004 Aoyama ................ 375/376

* cited by examiner

*Primary Examiner*—Linh My Nguyen
(74) *Attorney, Agent, or Firm*—Sterne, Kessler, Goldstein & Fox, P.L.L.C.

(57) ABSTRACT

A delay locked loop circuit with a first flip flop driven by a 0° clock and receiving the input data. A second flip flop by a 180° clock and receiving the input data. A first demultiplexer receives an output of the first flip flop and outputs peak data. A second demultiplexer receives an output of the second flip flop and outputs zero data. A timing recovery circuit outputs phase control bits based on the zero data and the peak data. A first phase interpolator outputs the 0° clock based on the phase control signal. A second phase interpolator outputs the 180° clock based on the phase control signal. A phase register receives the phase control signal from the timing recovery circuit. The first and second flip flops can be D flip flops. The first and second phase interpolators adjust relative phases of the 0° clock and 180° clock based on the phase control signal. The phase control signal can be a digital signal comprising a plurality of bits corresponding to a phase relationship between the 0° clock and 180° clock. The timing recovery circuit can be a digital circuit. The phase control signal is used to maintain a transition of the 0° clock near a center of an "eye" in the input data.

11 Claims, 6 Drawing Sheets

PHASE ADJUSTMENT METHOD AND CIRCUIT FOR DLL-BASED SERIAL DATA LINK TRANSCEIVERS

BACKGROUND OF THE INVENTION

1. Field of the Invention

The present invention is related to delay locked loops (DLLs), and more particularly, to reduction of jitter effects and improvement of link robustness in high-speed transceiver circuits using DLLs.

2. Related Art

DLL (Delay Locked Loop)-based clock and data recovery is widely used in high speed data links. DLL-based clock and data recovery has two clocks. One clock typically comes from external incoming data, and a second clock comes from a local phase locked loop (PLL) with a local reference clock. The DLL extracts clock information from the incoming data and tries to lock the two clocks to each other, using delays. Since there is usually no way to change the local frequency of the PLL, which is locked to the local reference frequency, the variable that can be changed is the phase of the PLL output clock, or, equivalently, the delay. A phase detector used in DLL-based data clock recovery is called a "bi-phase" detector. It uses the clock to sample the data during different phases of the clock to extract the timing information between the incoming data and local sampling clock. For example, it can sample the data in the middle of the symbol (the middle of the "eye") or towards the end of the symbol. This is then used to compare whether the local clock input is "ahead" or "behind" of the reference clock.

The loop in the DLL can be either an analog loop, or a digital loop. The DLL loop tries to determine whether the clock lags the data or leads the data. The phase of the sample clock is then adjusted accordingly. A phase interpolator is used to change the phase of the sample clock. Thus, the purpose of the phase interpolator is to lock the phase of the clock to the phase of the incoming data.

DLL based timing recovery is particularly popular for serial digital data communication. The advantage of this method is that all timing recovery is performed in digital domain with full programmability. It is specially suitable for multi-channel serial data link applications without interference among multiple on-chip PLLs running at different clock frequencies. A DLL-based timing recovery circuit uses a phase detector (a slicer), a deserializer (DMUX), digital timing recovery circuit and a phase interpolator, as shown in FIG. 1.

FIG. 1 illustrates a conventional DLL-based timing recovery circuit. As shown in FIG. 1, data is received into two D flip flops (DFFs) 102 and 108, which are clocked by the 0° clock and 180° clock, respectively. The DFFs 102, 108 output their outputs to demultiplexers 104, 110, respectively. The demultiplexers 104, 110 output peak data and zero data, respectively, into a digital timing recovery circuit 106. The digital timing recovery circuit 106 outputs phase control bits to a phase interpolator 112, which also takes as input various multiphase clocks, generated from the on-chip PLL locked to the local reference clock. The phase interpolator 112 outputs the 0° clock and the 180° clock waveforms to the DFFs 102, 108, respectively.

Thus, in the circuit of FIG. 1, the phase detector (i.e., the DFFs 102, 108) samples or slices input data at certain clock phase. The deserializer 109, 110 de-multiplexes high-speed serial data to low-speed parallel data. The digital timing recovery circuit 106 extracts timing information from incoming sampled data and sends timing control information to the phase interpolator 112. The phase interpolator 112 adjusts the clock phases accordingly for use by the slicers 102, 108 to sample the data.

The most critical component is the phase detector 102, 108. A typical topology of the phase detector 102, 108 is the "bang/bang" phase detector, embodied in a D flip flop. Its nature of implicit digital output is advantageous for digital signal processing. The phase interpolator 112 produces 0° clock (positive output) and 180° clock (negative or complementary output) to sample the data. When the loop is locked, the 0° clock should sample at the center of the eye and the 180° clock samples at the transition of data. The 0° clock-driven slicer/DMUX 102, 104 creates the data called "peak data" (also referred to as "real data") and the 180° clock-driven slicer/DMUX 108, 110 creates the data called "zero data" (referred to "zero-crossing point"). FIG. 2 shows the timing diagram at the input slicers 102, 108.

Ideally, the 0° clock waveform falls exactly in the middle of the data symbol, or exactly in the middle of the "eye". Similarly, the 180° clock waveform also has a transition exactly in the cross point of the eye. However, in practice, the clock phase always moves back and forth. In high-speed data circuits, this is primarily due to the performance of the D flip flops, which is the limiting factor in the DLL performance. Typically, the settling time and holding time of the D flip flops is asymmetric. This means that the sampling point is not optimized to be exactly in the center of the eye. The faster the data rate, the smaller the eye, and therefore the more critical it is to ensure that the 0° clock falls exactly in the center of the eye. Conventionally, moving the 0° clock transitions relative to the data has been difficult. This is due partly because of the high gain of the DLL loop, and partly because of the pattern-dependence of the phase detector. This can result in pattern-dependent jitter.

Thus, even with today's modern process technology, the settling/hold time of DFF is still a limiting factor for overall system performance, especially when incoming data has a lot of timing jitter. The imbalance between the settling time and hold time for a typical DFF can erode the limited timing margin of phase detector. Another important reason for phase adjustment is that the incoming data with non-Gaussian or asymmetric distributed timing jitter or ISI (Inter-Symbol Interference) will cause the locked sampling clock off the center of open eye due to the averaging nature of loop. Thus, phase adjustment is necessary for optimal sampling point. Meanwhile, phase adjustment can also provide the system level information of quality of incoming data by checking BER (Bit Error Rate) at different sampling points of the incoming data. A way to address phase adjustment is to put phase offset on phase interpolator in digital loop. Because of the data pattern-dependent nature of phase detector and the loop trying to compensate the offset by moving both sampling points, the phase adjustment may not achieve a stable sampling point or suffer pattern-dependent behavior.

Accordingly, there is a need in the art for a DLL with improved jitter performance.

SUMMARY OF THE INVENTION

The present invention is directed to a phase adjustment method and circuit for DLL-based serial data link transceivers that substantially obviates one or more of the problems and disadvantages of the related art.

An embodiment of the present invention includes a delay locked loop circuit with a first flip flop driven by a 0° clock and receiving the input data. A second flip flop by a 180° clock and receiving the input data. A first demultiplexer receives an output of the first flip flop and outputs peak data. A second demultiplexer receives an output of the second flip flop and outputs zero data. A timing recovery circuit outputs phase control bits based on the zero data and the peak data. A first phase interpolator outputs the 0° clock based on the phase control signal. A second phase interpolator outputs the 180° clock based on the phase control signal. A phase register receives the phase adjustment control signal from the timing recovery circuit, or from an additional microcontroller, or from other control registers. The first and second flip flops can be D flip flops. The first and second phase interpolators adjust relative phases of the 0° clock and 180° clock based on the phase control signal. The phase control signal can be a digital signal comprising a plurality of bits corresponding to a phase relationship between the 0° clock and 180° clock. The timing recovery circuit can be a digital circuit. The phase control signal is used to maintain a transition of the 0° clock near a center of an "eye" in the input data.

In another embodiment of the invention, a method of data recovery includes receiving the input data in a first and second slicer; demultiplexing the input data from the first and second slicers to generate zero data and peak data, respectively; generating phase control bits based on the zero data and the peak data; producing a 0° clock and a 180° clock based on the phase control signal; and continually sampling the input data at the slicers based on the 0° clock and the 180° clock. The 0° clock and 180° clock are generated using phase interpolators.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings.

DETAILED DESCRIPTION OF EMBODIMENTS OF THE INVENTION

Reference will now be made in detail to the embodiments of the present invention, examples of which are illustrated in the accompanying drawings.

In the present invention, two separate phase interpolators are used to ensure that the 0° clock waveform has transitions that fall exactly in the center of the eye. The 0° clock and the 180° clock waveforms keep the same relationship relative to each other. Thus, the loop behavior does not change, but the sampling point moves back and forth, as required by the position by the center of the eye. When the input data has a high degree of jitter, the proposed approach will result in the optimal sampling point. In turn, this results in improved performance and lower bit error rate. Thus, with the circuit of FIG. 3, discussed below, the loop will lock in on the 180° clock, and will place the 0° clock close to, if not exactly at, the center of the eye. Additionally, it is possible to move the sampling point back and forth, in order to determine the quality of the incoming data. The 180° clock is locked to the data, and the 0° clock can move to coincide with the center of the eye. The movement of the 0° clock can be accomplished based on, for example, the lowest bit error rate achievable.

Figure 1:
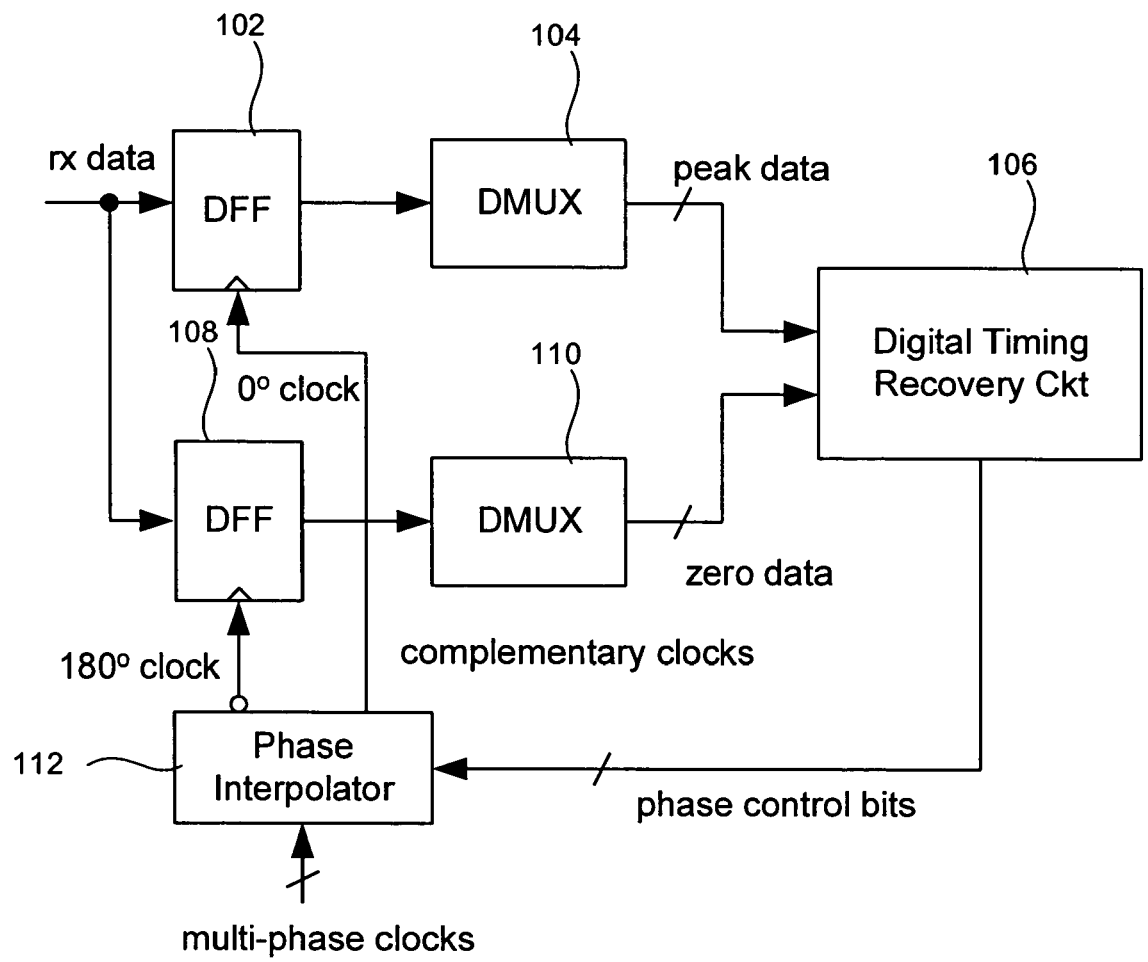
FIG. 1 shows a diagram of a conventional DLL-based timing recovery topology.
Figure 2:
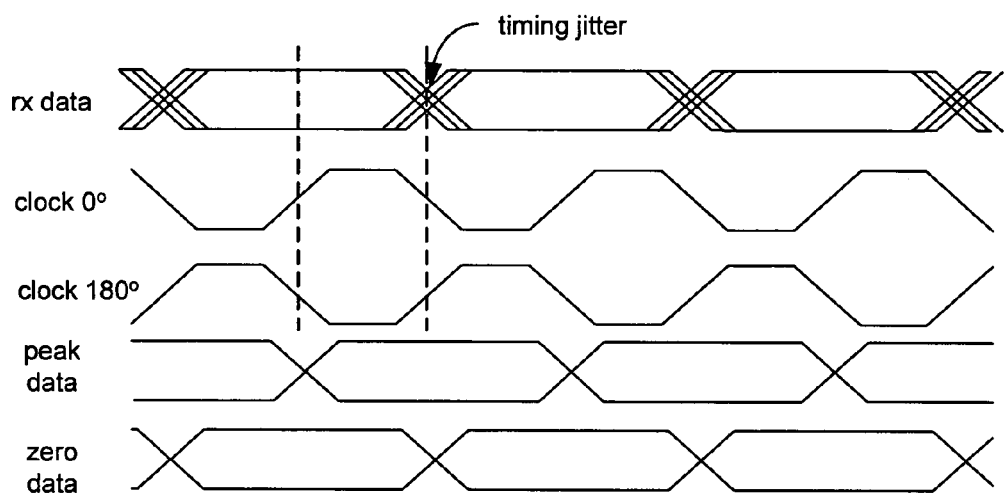
FIG. 2 shows a timing diagram at input slicers.
Figure 3:
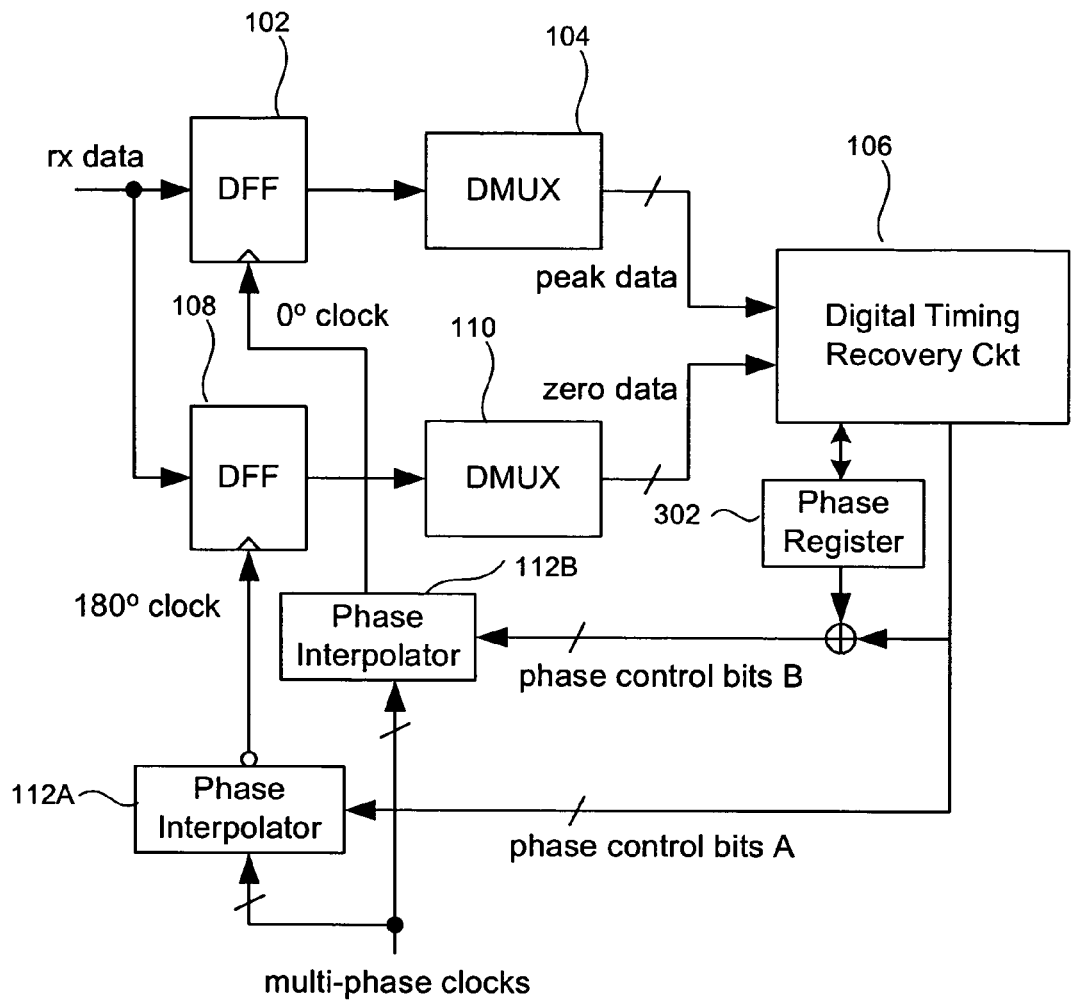
FIG. 3 shows a block diagram of a proposed DLL-based timing recovery with phase adjustment.
Figure 4:
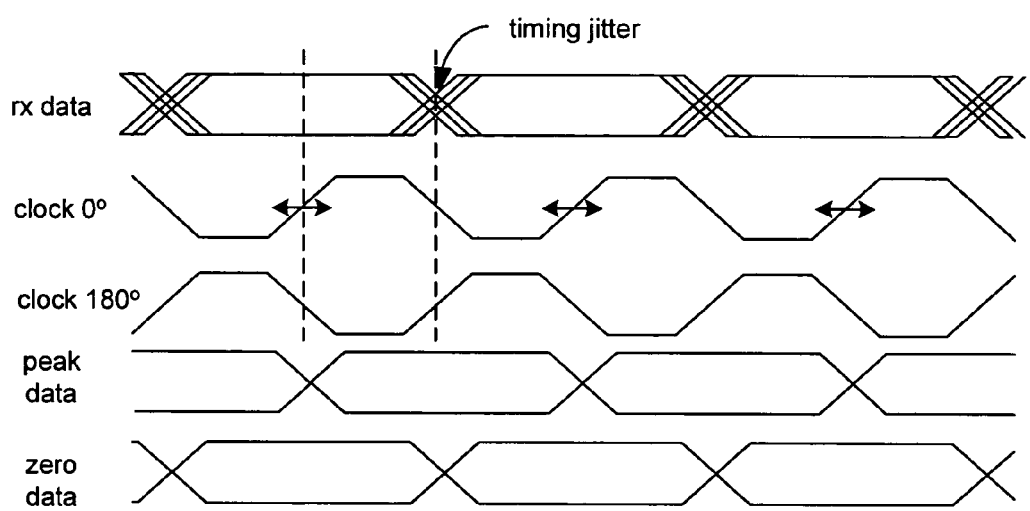
FIG. 4 shows a timing diagram of a proposed DLL-based timing recovery with phase adjustment.

FIG. 3 illustrates a block diagram of a proposed DLL-based timing recovery circuit with phase adjustment. As shown in FIG. 3, DFFs 102, 108, demultiplexers 104, 110, and digital timing recovery circuit 106 are arranged similar to the conventional circuit illustrated in FIG. 1. In addition, a phase register 302 is added. Two phase interpolators 112A, 112B are used, which output the 180° clock and the 0° clock, respectively. The phase register 302 is used to output phase control bits B to the phase interpolator 112B. Phase control bits A are used by the digital timing recovery circuit 106 to control the phase interpolator 112A. The phase control bits A and B may be used to delay the waveform outputs of the phase interpolators 112A, 112B by a fixed amount, in the case of a digital implementation. For example, with two control bits A, and two control bits B, the waveforms may be moved back and forth by 90 degrees. Similarly, with four control bits A and four control bits B, the clock waveforms may be moved back and forth by 360°/16=22.5°. In other words, the more control bits are used, the more precisely the relative phase between the two waveforms may be controlled.

Similarly, by combining several waveform generators within a phase interpolator, other delays, or phases, may be generated. Alternatively, by having a larger number of bits (e.g., 8 bits on the phase control bits A or B) it is possible to have a phase controlled to within, for example, about 1.5°.

Two identical phase interpolators can be employed to create 0° and 180° respectively. In default operation without phase adjustment, the control bits B and A for both phase interpolators 112A, 112B are same, while the 0° clock comes from the positive output of phase interpolator and the 180° clock comes from the negative output of phase interpolator. In this case, the circuit functions similar to the single-phase interpolator case of FIG. 1. The phase for the 0° clock can be adjusted easily using register bits. The circuit adds a fixed digital offset on control bits B for the 0° phase interpolator (112B), while control bits A for the 180° interpolator 112A are unchanged. Both are still updated by a digital timing recovery algorithm, which is explained with reference to FIGS. 5 and 6.

Figure 5:
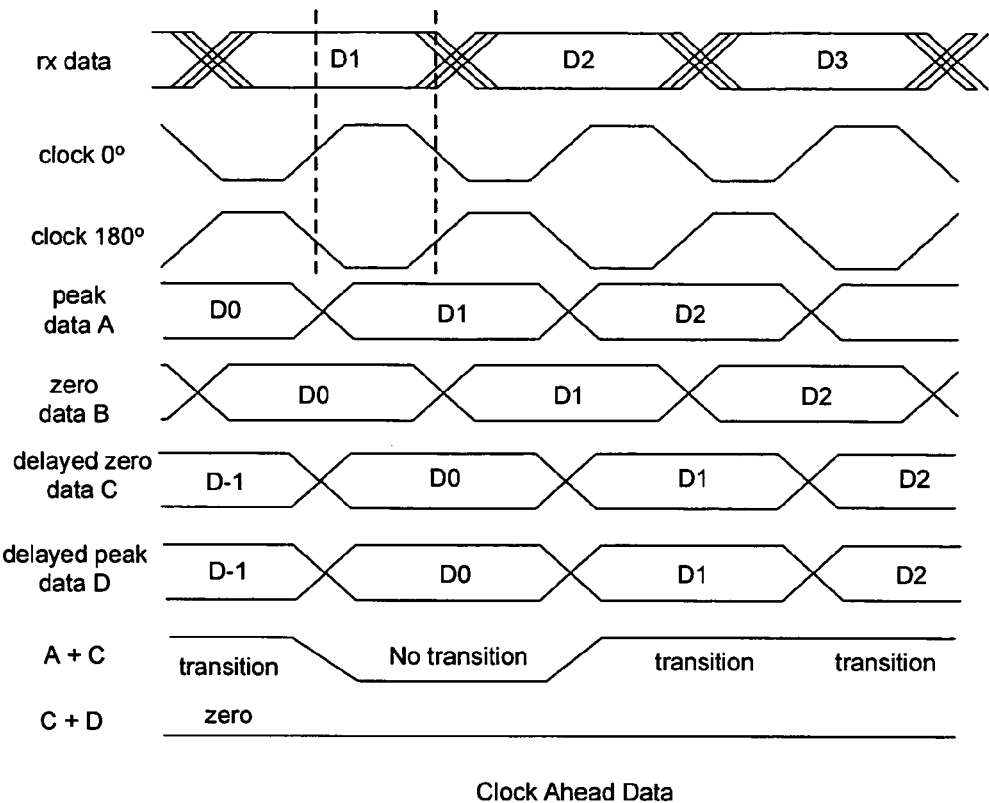
FIGS. 5 and 6 shows timing diagrams of operation of the digital timing recovery circuit.
Figure 6:
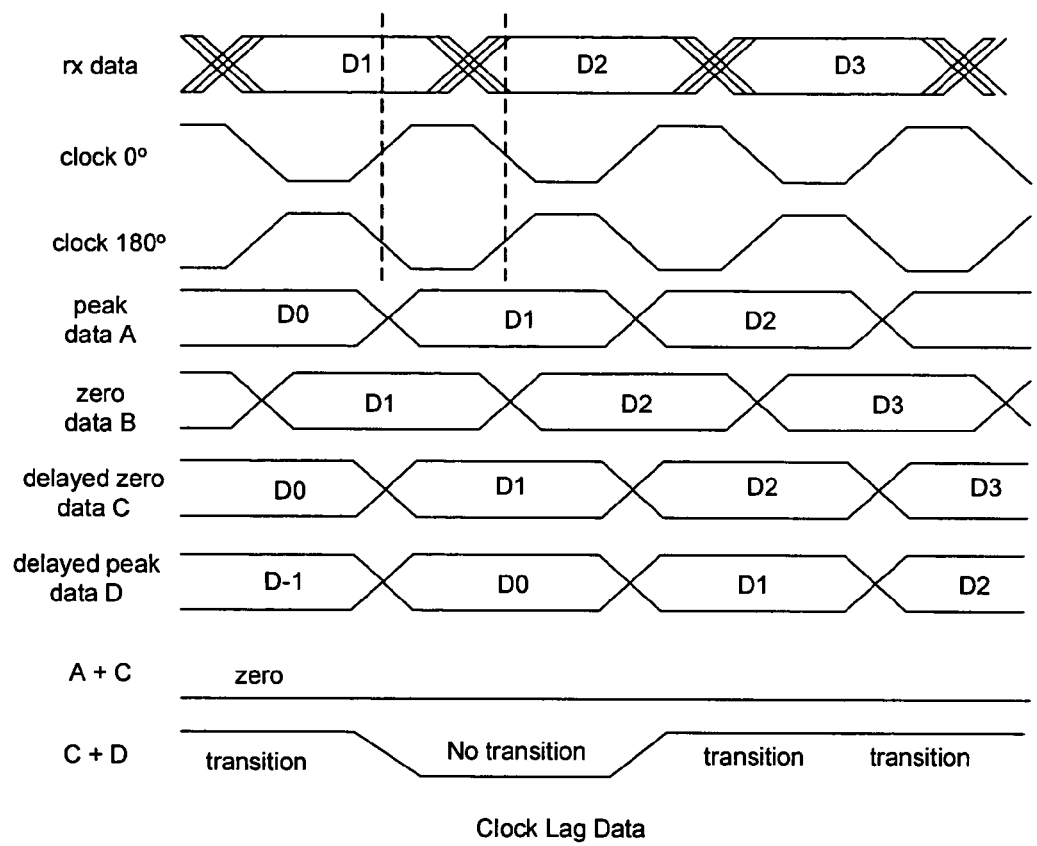

The phase detector samples the data at the 0° phase and 180° phase, which become peak data and zero data, and a digital algorithm compares current peak data with current zero data as and previous peak with current zero data using exclusive OR. If the clock 0° phase is ahead of data, C+D (C XOR D) is always zero and A+C (A XOR C) is 1, if data has a transition as shown in FIG. 5. If clock (0° phase) is lag of data, A+C is always zero and C+D is 1 if data has transition shown in FIG. 6. Depending on system baud rate, the exclusive OR can be performed at full rate or sub-full rate after de-serializing. The digital loop can be first-order integrator loop or second-order integrator loop or both. The integrators accumulate the clock ahead or lag information and when the accumulator reaches certain level (related to loop bandwidth), it will move the phase of the interpolator to adjust the sampling point. In other words, if the clock is ahead of the data, the interpolator will move the clock phase behind its previous position; if the clock is lagging the data, the interpolator will move the clock phase ahead of its previous position. When the loop is locked, the clock phase will be around the optimal point. If the incoming data and clock have a small frequency offset, e.g., 200 ppm, the phase will keep jumping ahead or backward to the tracking frequency drift, but will still maintain optimal sampling point for 0° clock phase, i.e., the center position of input data. Typically, a first order loop works adequately, but a second-order loop provides more tracking power of frequency offset and less data pattern dependency.

Since peak data output will not change after the phase shift, assuming the phase jump is less than one quarter of total period, DLL loop behavior is unchanged but the sample point of the data is changed digitally. The phase adjustment is achieved instantly even without loop response, which is needed in the single phase-interpolator case. Phase adjustment can be performed by manually added offset or by the loop itself, with additional processor power. With such phase adjustment ability, the DLL loop with a BER checker or an FEC (Forward Error Correction) block can determine the quality of eye and choose the optimal sampling point automatically. With an optimal sampling point, the system can achieve maximum jitter tolerance, and therefore, a more reliable data link. Although an additional phase interpolator is used, the load of each phase interpolator is the half of the case for single phase-interpolator system, and thus there is no power penalty.

It will be appreciated that although the circuit shown in FIG. 3 is a digital circuit, an analog implementation is also possible. Analog DLLs are known in the art. The phase interpolators 112A, 112B, and the phase register 302 may also be implemented in analog form, with the phase control bits A and B replaced by voltages that control the phase relationship between the two phase interpolators 112A, 112B.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A delay locked loop circuit comprising:
a first flip flop driven by a 0° clock and receiving the input data;
a second flip flop driven by a 180° clock and receiving the input data;
a first demultiplexer receiving an output of the first flip flop and outputting peak data;
a second demultiplexer receiving an output of the second flip flop and outputting zero data;
a timing recovery circuit that outputs a phase control signal based on the zero data and the peak data;
a first phase interpolator outputting the 0° clock based on the phase control signal; and
a second phase interpolator outputting the 180° clock based on the phase control signal.

2. The circuit of claim 1, further comprising a phase register receiving the phase control signal from the timing recovery circuit.

3. The circuit of claim 1, wherein the first and second flip flops are DQ flip flops.

4. The circuit of claim 1, wherein the first and second phase interpolators adjust relative phases of the 0° clock and 180° clock based on the phase control signal.

5. The circuit of claim 1, wherein the phase control signal is a digital signal comprising a plurality of bits corresponding to a phase relationship between the 0° clock and 180° clock.

6. The circuit of claim 1, wherein the timing recovery circuit is a digital circuit.

7. The circuit of claim 1, wherein the phase control signal is used to maintain a transition of the 0° clock near a center of an "eye" in the input data.

8. A method of data recovery comprising:
receiving the input data in a first and second slicer;
demultiplexing the input data from the first and second slicers to generate zero data and peak data, respectively;
generating a phase control signal based on the zero data and the peak data;
producing a 0° clock and a 180° clock based on the phase control signal using phase interpolators; and
continually sampling the input data at the slicers based on the 0° clock and the 180° clock.

9. The circuit of claim 8, wherein the first and second slicers are D flip flops.

10. The circuit of claim 8, wherein the phase control signal is a digital signal comprising a plurality of bits corresponding to a phase relationship between the 0° clock and 180° clock.

11. The circuit of claim 8, further comprising using the phase control signal is used to maintain a transition of the 0° clock near a center of an "eye" in the input data.

* * * * *